(12) United States Patent
Twiss

(10) Patent No.: US 9,894,795 B1
(45) Date of Patent: Feb. 13, 2018

(54) ELECTRICAL HARDWARE MODULE RETENTION INTERLOCK

(71) Applicant: Robert Gregory Twiss, Chapel Hill, NC (US)

(72) Inventor: Robert Gregory Twiss, Chapel Hill, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/431,983

(22) Filed: Feb. 14, 2017

(51) Int. Cl.
*H05K 5/02* (2006.01)
*H05K 7/14* (2006.01)
*H05K 7/02* (2006.01)

(52) U.S. Cl.
CPC ......... *H05K 7/1461* (2013.01); *H05K 5/0208* (2013.01); *H05K 5/0256* (2013.01); *H05K 7/026* (2013.01)

(58) Field of Classification Search
None
See application file for complete search history.

(56) References Cited

U.S. PATENT DOCUMENTS

| | | | |
|---|---|---|---|
| 9,313,909 B1* | 4/2016 | Huang | G11B 33/128 |
| 2014/0177144 A1* | 6/2014 | Wu | G06F 1/1613 |
| | | | 361/679.01 |
| 2014/0185199 A1* | 7/2014 | Chen | H05K 5/0295 |
| | | | 361/679.01 |
| 2015/0245515 A1* | 8/2015 | Baek | G06F 1/1613 |
| | | | 361/679.4 |

* cited by examiner

*Primary Examiner* — Xanthia C Cunningham
(74) *Attorney, Agent, or Firm* — P. Su

(57) ABSTRACT

According to one aspect, an apparatus includes a body and a toggle-interlock assembly. The body has an opening defined therein. The toggle-interlock assembly is coupled to the body, and includes a toggle portion and an interlock portion. The toggle-interlock assembly has a first configuration and a second configuration. When the toggle-interlock assembly is in a first configuration, the toggle portion physically blocks at least part of the opening while the interlock portion is stowed. When the toggle-interlock assembly is in a second configuration, the toggle portion does not physically block access to the opening while the interlock portion is in a deployed position that is arranged to prevent the apparatus from being inserted into a chassis.

15 Claims, 8 Drawing Sheets

ELECTRICAL HARDWARE MODULE RETENTION INTERLOCK

TECHNICAL FIELD

The disclosure relates generally to computing and networking equipment. More particularly, the disclosure relates to an interlock system which is arranged to effectively constrain modules such as cards to being inserted into and/or removed from an overall assembly in a desired sequence.

BACKGROUND

Electrical and networking, or telecommunications, equipment is often configurable using different components which are inserted into, or otherwise plugged into, a chassis. Chassis-based line card systems with pluggable interface modules are often part of electrical and networking equipment. Some chassis-based line card systems use multiple levels of nesting, in which pluggable interface modules may be plugged into other pluggable interface modules.

Within systems in which pluggable interface modules are nested, it is often important that certain modules and/or sub-modules are removed in a particular order. For example, it may be necessary to first power down a parent module before removing a sub-module that is plugged into the parent module, and when the sub-module is removed before the parent module is powered down, the sub-module may be destroyed or otherwise be compromised.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

Figure 1A:
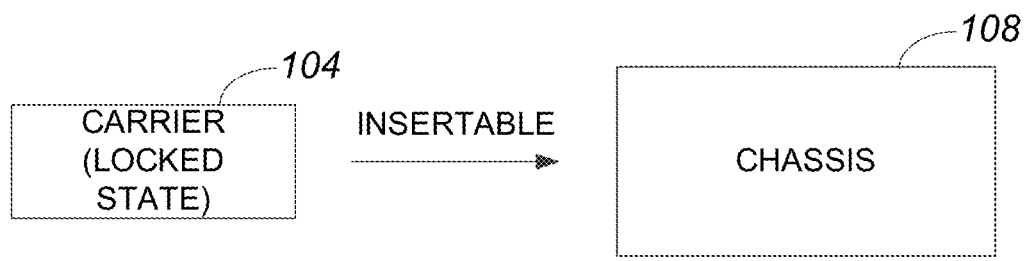
FIG. 1A is a block diagram representation of a carrier in a locked state and a chassis in accordance with an embodiment.

In one embodiment, an apparatus includes a body and a toggle-interlock assembly. The body has an opening defined therein. The toggle-interlock assembly is coupled to the body, and includes a toggle portion and an interlock portion. The toggle-interlock assembly has a first configuration and a second configuration. When the toggle-interlock assembly is in a first configuration, the toggle portion physically blocks at least part of the opening while the interlock portion is stowed. When the toggle-interlock assembly is in a second configuration, the toggle portion does not physically block access to the opening while the interlock portion is in a deployed position that is arranged to prevent the apparatus from being inserted into a chassis.

DESCRIPTION

The use chassis-based line card systems in which modules may be nested within other modules, e.g., sub-modules may be nested within modules, is proliferating. For example, a module may be a carrier that is nested within another module that is also a carrier. In many applications, the order in which modules are inserted into other modules or a chassis, and/or the order in which modules are removed from other modules or a chassis, may be critical to insure the integrity of the modules or ensuring acceptable system performance. For example, if power to a module is not properly cut before the module is removed from a chassis, electrical circuits in the module may be damaged. Further, removing a module from a chassis before software operating with respect to the module has been able to shut down the module may compromise the future operation of the module and/or may prevent communications traffic routed to the module from being redirected properly.

The ability to substantially prevent a carrier from being inserted into a chassis while a module or sub-module may be inserted into the carrier, and to substantially prevent a carrier from being removed from a chassis while a module or sub-module may be removed from the chassis, reduces the likelihood that a module and/or a chassis may be manipulated in an undesirable order. The use of a locking mechanism may allow the order in which modules may be manipulated with respect to carriers, and/or carriers may be manipulated with respect to chassis to be substantially controlled.

In one embodiment, a single interlock assembly may lock a module within a carrier, while allowing the carrier to be inserted into and/or removed from a chassis. It should be appreciated that the carrier is generally a module, and another module that is arranged to be locked within the carrier may be considered to be a sub-module. An interlock assembly may also allow a module to be removed from a carrier, while substantially preventing the carrier from being inserted into and/or removed from a chassis. The use of an interlock assembly that, when locked, is arranged to lock a module within a carrier while allowing the carrier to be inserted into and/or removed from a chassis, and, when unlocked, is arranged to allow the module to be removed from the carrier while substantially preventing the carrier from being inserted into and/or removed from the chassis effectively specifies or otherwise determines a sequence in which a module may be inserted or removed. By essentially "forcing" or effectively constraining an order in which a module is inserted into or removed from a carrier, and a carrier is inserted into or removed from a chassis, the proper operation of the module and carrier may effectively be facilitated.

In general, while a carrier is in a locked state such that a module may not be inserted into or removed from the carrier, the carrier may be inserted into a chassis. On the other hand, while a carrier is in an unlocked state such that a module may be inserted into or removed from the carrier, the carrier may not be inserted into a chassis. Referring initially to FIG. 1A, the insertion of a carrier in a locked state into a chassis will be described in accordance with an embodiment. A carrier 104 may be in a locked state and, when carrier 104 is in the locked state, carrier 104 may be inserted into, or otherwise introduced into or placed in, a chassis 108. When carrier 104 is in a locked state, a module (not shown) already inserted in carrier 104 may not be removed. In addition, when carrier 104 is in a locked state, a module (not shown) that is not already inserted in carrier 104 may not be inserted into carrier 104.

Carrier 104 is effectively physically configured such that when carrier 104 is in a locked state, carrier 104 is insertable into chassis 108. In one embodiment, carrier 104 includes a physical feature that is in a stowed position when carrier 104 is in a locked state. When the physical feature is in a stowed position, the physical feature does not impede the insertion of carrier 104 into chassis 108.

Figure 1B:
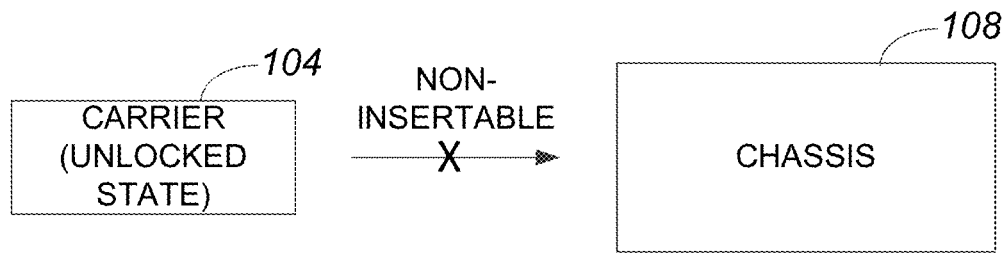
FIG. 1B is a block diagram representation of a carrier in an unlocked state and a chassis, e.g., carrier 104 and chassis 108 of FIG. 1A, in accordance with an embodiment.

FIG. 1B is a representation of carrier 104 in an unlocked state in accordance with an embodiment. When carrier 104 is in an unlocked state, carrier 104 is prevented from being inserted into chassis 108 while a module (not shown) may be inserted into carrier 104. When carrier 104 is in the unlocked state, any module (not shown) that is already inserted in carrier 104 may be removed from carrier 104.

Figure 2A:
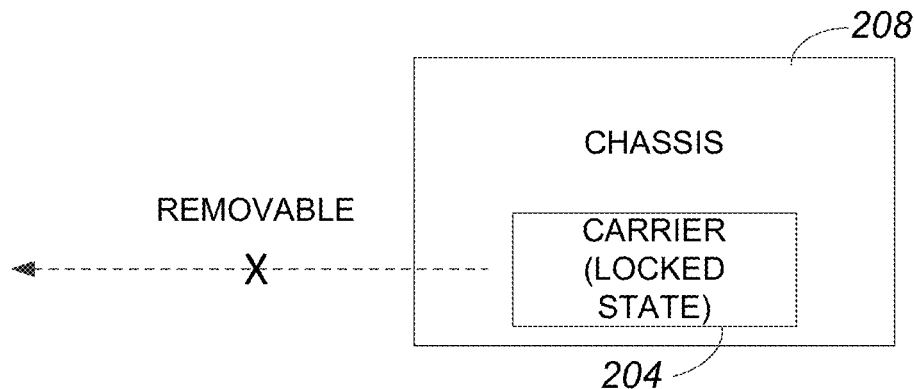
FIG. 2A is a block diagram representation of a carrier in a locked state inserted in a chassis in accordance with an embodiment.
Figure 2B:
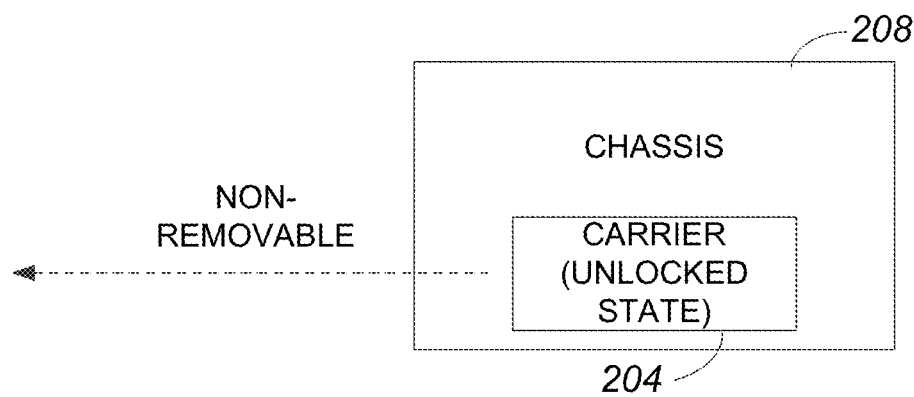
FIG. 2B is a block diagram representation of a carrier in an unlocked state inserted in a chassis, e.g., carrier 204 and chassis 208 of FIG. 2A, in accordance with an embodiment.

Referring next to FIGS. 2A and 2B, a carrier inserted in a chassis will be described. FIG. 2A is a block diagram representation of a carrier in a locked state inserted in a chassis in accordance with an embodiment, and FIG. 2B is a block diagram representation of a carrier in an unlocked state inserted in a chassis in accordance with an embodiment. A carrier 204 may be in a locked state and inserted within a chassis 208, as shown in FIG. 2A. When carrier 204 is in a locked state, carrier 204 may be removed from chassis 208. When carrier 204 is in a locked state, a module (not shown) already inserted in carrier 204 may not be removed. In addition, when carrier 204 is in a locked state, a module (not shown) that is not already inserted in carrier 204 may not be inserted into carrier 204.

Carrier 204 is effectively physically configured such that when carrier 204 is in a locked state, carrier 204 may be removed from chassis 208. In one embodiment, carrier 204 includes a physical feature that is in a stowed position when carrier 204 is in a locked state. When the physical feature is in a stowed position, the physical feature does not impede the removal of carrier 204 from chassis 208.

FIG. 2B is a representation of carrier 204 in an unlocked state while inserted in chassis 208 in accordance with an embodiment. When carrier 204 is in an unlocked state, carrier 204 is prevented from being removed from chassis 208. In one embodiment, when carrier 204 is in an unlocked state, a module (not shown) may be inserted into carrier 204, while any module that is already inserted in carrier 204 may be removed from carrier 204. It should be appreciated, however, that in other embodiments, when carrier 204 is in an unlocked state, no module (not shown) may be inserted into or removed from carrier 204. That is, in some embodiments, when a module (not shown) is already inserted in carrier 204 while carrier 204 is inserted in chassis 208, the module may not be removed, and when the module is not already inserted in carrier 204 while carrier 204 is inserted in chassis 208, the module may not be inserted in carrier 204.

Figure 3:
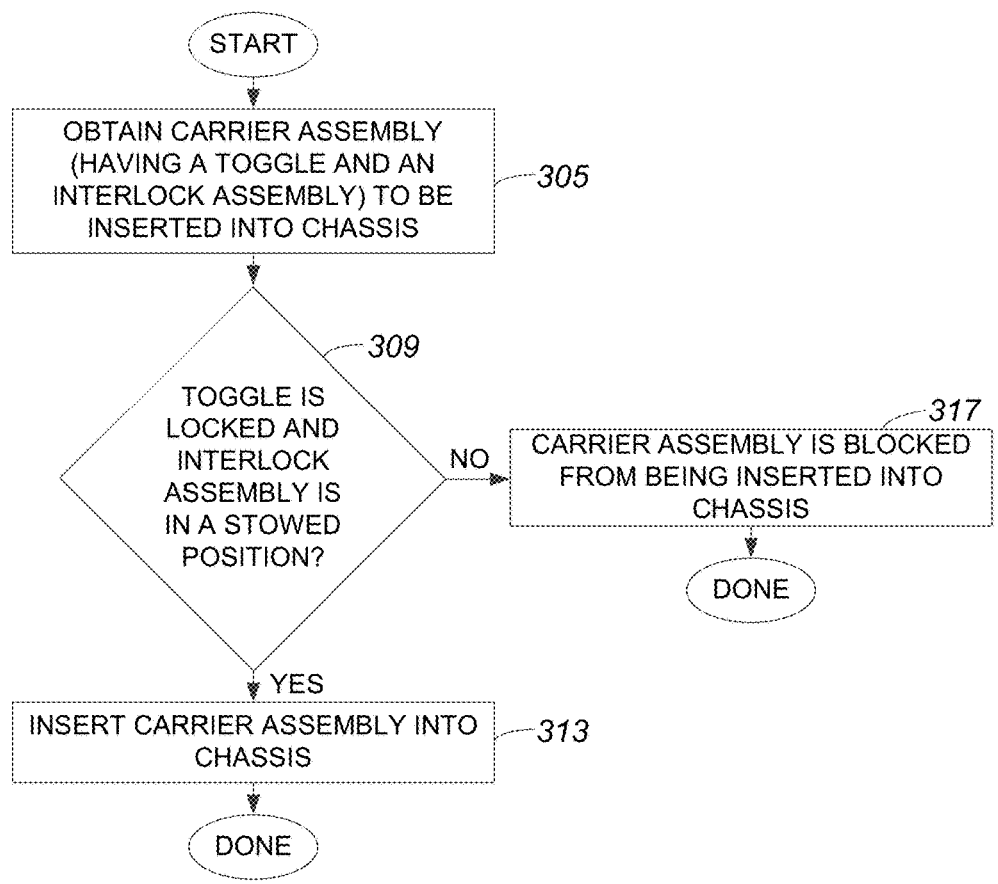
FIG. 3 is a process flow diagram which illustrates a method of inserting a carrier assembly into a chassis in accordance with an embodiment.

Any suitable mechanism may be used to allow a carrier such as carrier 204 to be in a locked state while substantially enabling the carrier to be inserted into a chassis, and to allow the carrier to be in an unlocked state while substantially preventing the carrier from being inserted into the chassis. In one embodiment, a suitable mechanism may be a toggle and interlock assembly. FIG. 3 is a process flow diagram which illustrates a method of inserting a carrier assembly that has a toggle and interlock assembly, e.g., an overall a toggle-interlock assembly, into a chassis in accordance with an embodiment. A method 301 of inserting a carrier assembly into a chassis begins at step 305 in which a carrier assembly, which has a toggle and an interlock assembly that are substantially coupled, is to be inserted into a chassis. The carrier assembly may be, in one embodiment, a module arranged to receive a card such as a memory card, while the chassis may be a computing system that is configured to receive the carrier assembly such that the card may be used within the carrier assembly.

From step 305, process flow moves to step 309 in which it is determined whether the toggle associated with the toggle is locked, and the interlock assembly included in the carrier assembly, is in a stowed position. That is, it is determined whether the carrier assembly is in a configuration that enables the carrier assembly to be inserted into the chassis. It should be appreciated that, in one embodiment, when the toggle is in a locked position, a submodule such as a card may not be inserted into the carrier assembly. Because the toggle and the interlock assembly are substantially coupled, when the toggle is in a locked position, the interlock assembly is effectively arranged in a stowed position such that the interlock assembly does not prevent, or otherwise impede, the insertion of the carrier assembly into the chassis. In one embodiment, when the toggle is in a locked position and the interlock assembly is in a stowed position, the carrier assembly may be considered to be in a locked state. Similarly, when the toggle is in an unlocked position and the interlock assembly is in a deployed position, the carrier assembly may be considered to be in an unlocked state.

If the determination in step 309 is that the toggle is locked and the interlock assembly is in a stowed position, then the carrier assembly is inserted into the chassis in step 313, and the method of inserting a carrier assembly into a chassis is completed. Alternatively, if the determination in step 309 is that the toggle is not locked and the interlock assembly is not in a stowed position, the indication is that the interlock assembly is in a substantially deployed position. When the interlock assembly is in a substantially deployed position, the interlock assembly effectively provides a physical barrier or obstacle that prevents the chassis assembly from being inserted into the chassis. As such, when the determination is that the toggle is not locked and the interlock assembly is not in a stowed position, the carrier assembly is blocked from being inserted into the chassis in step 317, and the method of inserting a carrier assembly into a chassis is terminated.

Figure 4:
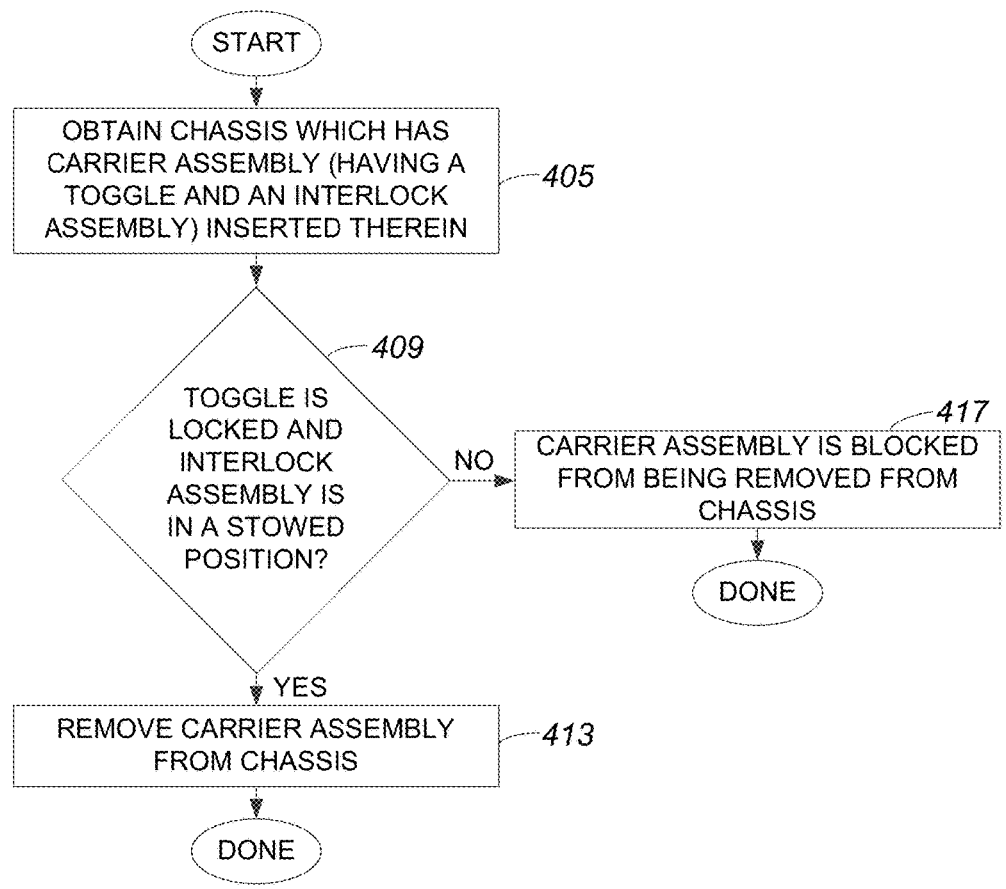
FIG. 4 is a process flow diagram which illustrates a method of removing a carrier assembly from a chassis in accordance with an embodiment.

With reference to FIG. 4, a method of removing a carrier assembly that has a toggle and an interlock assembly, e.g., an overall a toggle-interlock assembly, from a chassis will be described in accordance with an embodiment. A method 401 of removing a carrier assembly from a chassis begins at step 405 in which a chassis, in which a carrier assembly with a toggle and interlock assembly is inserted, is obtained. Upon obtaining the chassis in which the carrier assembly is inserted, a determination is made in step 409 in which it is determined whether the toggle is locked and the interlock assembly is in a stowed, or otherwise undeployed, position.

When the toggle is locked and the interlock assembly is in a stowed position, a toggle is arranged to prevent a module or submodule from being removed from and/or inserted into the carrier assembly, while the carrier assembly may be removed from the chassis. That is, when the toggle is locked and interlock assembly is in a stowed position, the carrier assembly may be substantially decoupled from the chassis while a module or sub-module may be prevented from being removed from and/or inserted into the carrier assembly.

If the determination in step 409 is that the toggle is locked and the interlock assembly is in a stowed position, the indication is that the carrier assembly may be substantially safely removed from the chassis. As such, in step 413, the carrier assembly is removed from the chassis, and the method of removing a carrier assembly from a chassis is completed.

Alternatively, if the determination in step 409 is that the toggle is not locked and the interlock assembly is not in a stowed position, the implication is that the interlock assembly is locked or deployed such that the carrier assembly is effectively locked in the chassis. As such, the carrier assembly is essentially blocked from being removed from the chassis in step 417, and the method of removing a carrier assembly from a chassis is terminated.

It should be appreciated that, in some embodiments, an interlock assembly is configured such that the interlock assembly may not be moved from a locked position to a deployed position while a carrier assembly is positioned in a chassis. For example, obstructions may be present within the chassis to substantially prevent the interlock assembly from being set in a deployed position once the carrier assembly is substantially inserted in a chassis. In such embodiments, sub-modules may neither be removed from nor inserted into a carrier assembly once the carrier assembly is substantially inserted in a chassis.

Figure 5A:
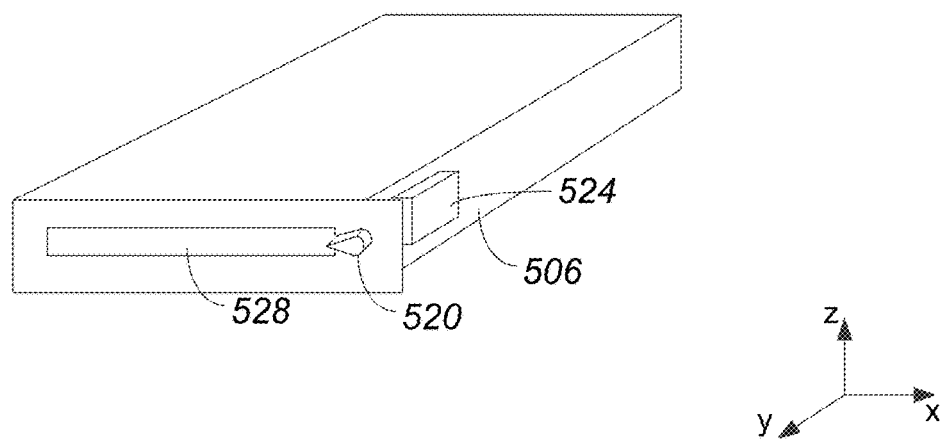
FIG. 5A is a diagrammatic representation of a carrier assembly having an interlock arrangement in a stowed position in accordance with an embodiment.
Figure 5B:
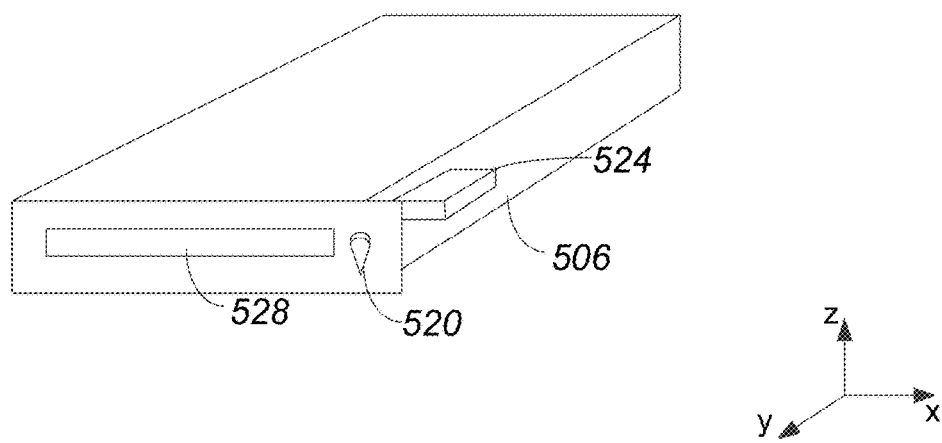
FIG. 5B is a diagrammatic representation of a carrier assembly, e.g., carrier assembly 504 of FIG. 5A, having an interlock arrangement in a locked position in accordance with an embodiment.

Referring next to FIGS. 5A and 5B, a carrier assembly having an interlock arrangement will be described in accordance with an embodiment. FIG. 5A is a diagrammatic representation of a carrier assembly having an interlock arrangement in a stowed position, while FIG. 5B is a diagrammatic representation of the carrier assembly having the interlock arrangement in a locked position. A carrier assembly 504, as shown in FIG. 5A, includes an interlock assembly that has a toggle 520 and a flap 524 that are movably coupled to a body 506 of carrier assembly 504. An opening 528 is defined within carrier 528 that is arranged to receive a sub-module (not shown), e.g., a card or an adapter, when toggle 520 is in an "open" or unlocked position. It should be appreciated that toggle 520 is in an unlocked position when toggle 520 does not obstruct or partially block opening 528 such that a sub-module (not shown) that is already inserted in opening 528 may not be removed or such that a sub-module (not shown) that is not already inserted in opening 528 may not be inserted. As shown in FIG. 5A, toggle 520 is in a "closed" or locked position, in which case toggle 520 effectively blocks a sub-module (not shown) that is already inserted in opening 528 from being removed or prevents a sub-module (not shown) that is not already inserted in opening 528 from being inserted.

When toggle 520 is in a locked position, flap 524 is in a stowed position. In one embodiment, as will be described below with respect to FIG. 6, toggle 520 and flap 524 are physically coupled such that when toggle 520 is in a locked position, flap 524 is in a stowed position. Toggle 520 and flap 524 effectively form an interlock arrangement.

As shown in FIG. 5B, when toggle 520 is in an unlocked position, flap 524 is in a deployed position. When flap 524 is in a deployed position, flap 524 is arranged to effectively extend outwards from body 506 along an x-axis. In the described embodiment, flap 524 is arranged to substantially rotate approximately ninety degrees with respect to a y-axis to move between a stowed position and a deployed position.

In general, carrier assembly 504 may be inserted at least partially into an opening in a chassis (not shown). When flap 524 is in a stowed position, as shown in FIG. 5A, flap 524 is arranged to substantially allow carrier 504 from being inserted into the opening of a chassis (not shown). On the other hand, when flap 524 is in a deployed position, as shown in FIG. 5B, flap 524 is arranged to extend outwardly from carrier 504 to substantially prevent carrier assembly 504 from being inserted fully into the opening of a chassis (not shown). It should be appreciated that when carrier assembly 504 is already inserted into an opening in a chassis (not shown), when flap 524 is in a stowed position, carrier assembly 504 may be removed from the chassis, and when flap 524 is in a deployed position, carrier assembly 504 is effectively prevented from being removed from the chassis. As previously mentioned, in some embodiment, a chassis (not shown) may be arranged such that a flap 524 may not be deployed while carrier assembly 504 is inserted in the chassis.

Figure 6:
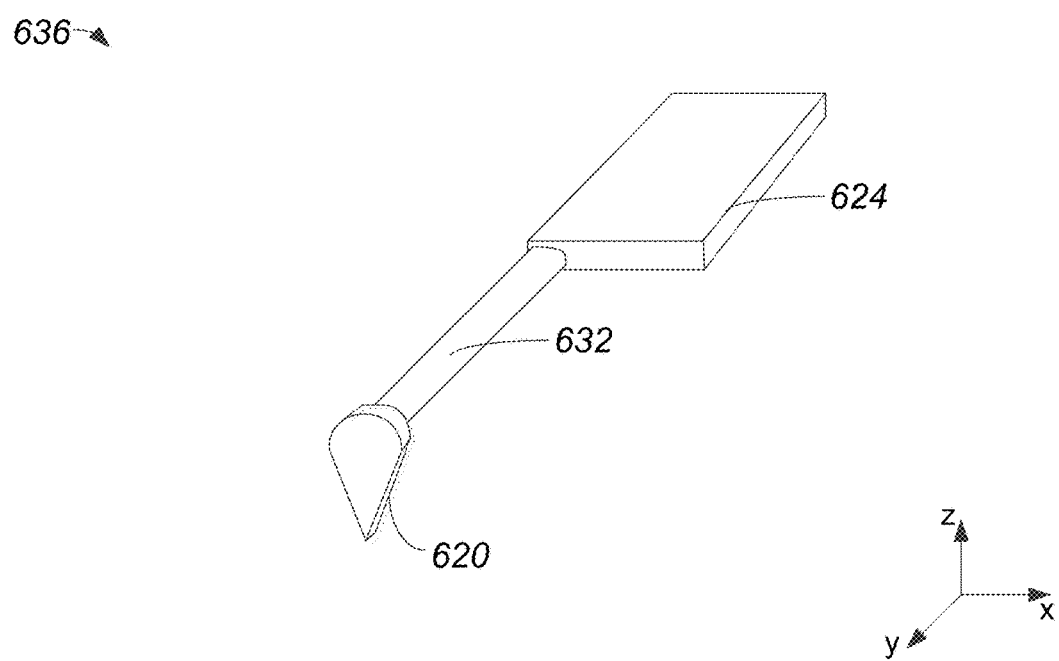
FIG. 6 is a diagrammatic representation of an interlock arrangement in accordance with an embodiment.

FIG. 6 is a diagrammatic representation of a toggle-interlock arrangement in accordance with an embodiment. A toggle-interlock arrangement or assembly 636 includes a toggle 620 and a flap 624 which are substantially connected by a rod 632. Rod 632 may be any suitable rotating member, e.g., rod 632 may be a cylindrical rod or a hexagonal rod. It should be appreciated that a cylindrical rod will generally have a round or ovular cross-sectional shape, and that a hexagonal rod will have a substantially hexagonal cross-sectional shape. When toggle-interlock arrangement 636 is rotated about a y-axis, toggle 620 rotates from an unlocked position to a locked position while flap 624 rotates from a deployed position to a stowed position.

In one embodiment, toggle-interlock arrangement 636 may be indexed or otherwise include features (not shown) which are arranged to effectively constrain toggle-interlock arrangement 636 from rotating more than approximately ninety degrees with respect to a y-axis. It should be appreciated that features which effectively constrain toggle-interlock arrangement 636 from rotating more than approximately ninety degrees may instead, or additionally, be included on a carrier body (not shown) that is substantially coupled to toggle-interlock arrangement 636. Arrangement 636 may also include other locking features (not shown) that are internal to a carrier assembly and may not be substantially visible to the user. For example, a protrusion (not shown) may be substantially coupled along rod 632 that is arranged to lock against a separate structure (not shown) associated with a carrier assembly or a chassis. When other locking features (not shown) are substantially internal to a carrier assembly or a chassis, toggle 620 may effectively be a visual indicator which indicates whether toggle-interlock arrangement 636 is locked or unlocked, while the locking features are effectively the mechanism which provides locking or unlocking capabilities.

Materials used to form toggle-interlock arrangement 636 may vary widely. In one embodiment, toggle 620 may be formed from aluminum, rod 632 may be formed from extruded Delrin, and flap 624 may be formed from molded polycarbonate plastic. Toggle 620 may include an externally visible indicator (not shown) that is constrained to substantially freely rotate about the y-axis between an unlocked position and a locked position. Toggle 620 may slide over an end of rod 632, and may be coupled to rod 632 using an axial screw. Rod 632 is typically constrained to rotate about the y-axis, and when rod 632 has a hexagonal cross-sectional shape, a relatively low-friction and wide-toleration rotational surface is provided, and fixed keying may effectively be ensured between rod 632 and toggle 620, as well as between rod 632 and flap 624.

Figure 7A:
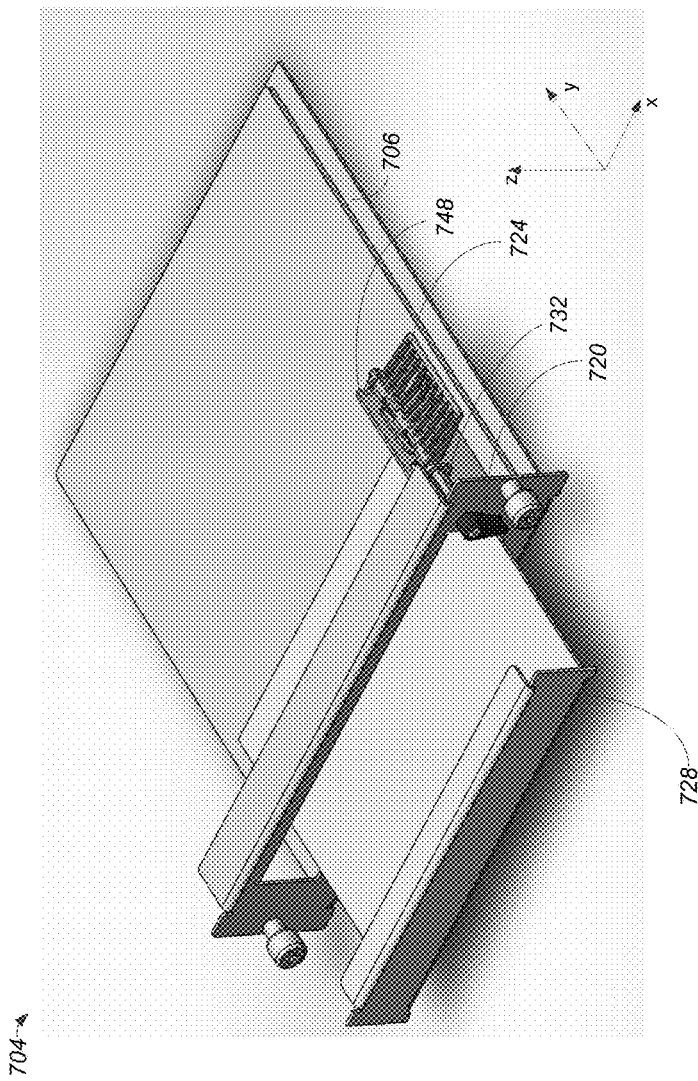
FIG. 7A is a diagrammatic representation of a carrier assembly with a module in an open, unlocked position in accordance with an embodiment.
Figure 7B:
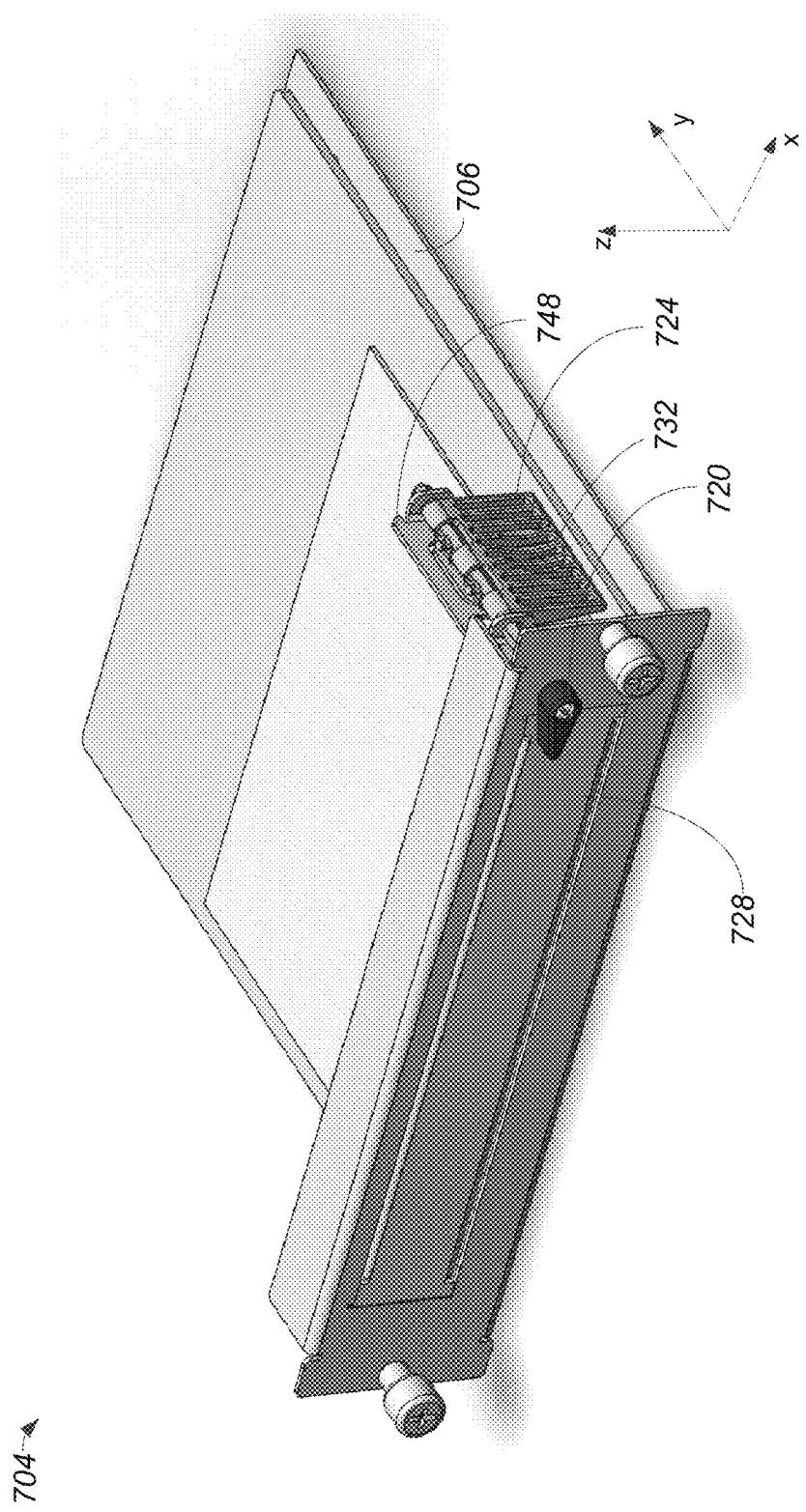
FIG. 7B is a diagrammatic representation of a carrier assembly with a module, e.g., module 728 of FIG. 7A, in a closed, locked position in accordance with an embodiment.

The configuration of a carrier assembly may generally vary widely. With reference to FIGS. 7A and 7B, one suitable configuration of a carrier assembly will be described in accordance with an embodiment. FIG. 7A is a diagrammatic representation of a carrier assembly with a module in an open, unlocked position, while FIG. 7B is a diagrammatic representation of the carrier assembly in a closed, locked position. A carrier assembly 704 includes a carrier body 706, a toggle 724, a rod 732, and a flap 720. Toggle 720, rod 732, and flap 724 form a toggle-interlock assembly. In the described embodiment, carrier assembly 704 includes a detent spring plate 748 which is arranged to effectively force a preferential orientation for flap 724. Carrier assembly 704 may also include protrusion features (not shown) on flap 724 that seat into corresponding recesses or holes in spring plate 724 to effect preferential detent positions. The resulting preferential orientation for flap 724 may be a horizontal orientation or a vertical orientation.

Flap 724 may include a molded-in flexure array feature that enables flap 724 to be substantially stiff in one direction, e.g., along an x-axis in a deployed position, while substantially being relatively easily elastically deformed in another direction, e.g., in a y-axis direction. In one embodiment, flap 724 may include a molded hemispherical ball detent features that enable flap 724 to effectively mate with recesses situated detent spring plate 748.

A sub-module 728, which may be a card or an adapter, is arranged to be moved into and out of carrier body 706 when toggle 720 is in an unlocked position as shown in FIG. 7A. When toggle 720 is in an unlocked position, carrier assembly 704 is effectively prevented from being inserted into and/or removed from a chassis (not shown) due to the deployed position of flap 724.

As shown in FIG. 7B, when toggle 720 is in a locked position, sub-module 720 is arranged not to be able to move into or out of carrier body 706. Due to the stowed position of flap 724, when toggle 720 is in a locked position, carrier assembly 704 may be moved into or out of a chassis (not shown). Thus, sub-module 720 may not be inserted or removed from carrier body 706 unless carrier assembly 704 is locked into place in a chassis (not shown) or not positioned within the chassis. Thus, the insertion and/or removal of sub-module 720 from carrier body 706 and the insertion and/or removal of carrier assembly 704 may effectively be constrained to occur in a preferred sequence.

Although only a few embodiments have been described in this disclosure, it should be understood that the disclosure may be embodied in many other specific forms without departing from the spirit or the scope of the present disclosure. By way of example, a sub-module that may be inserted into a module such as a carrier may be widely varied. In one embodiment, the sub-module may be, but is not limited to being, a card such as a line card, and adapter, or a blank which may be substantially any component arranged to fill a slot or an opening in a sub-module for electromagnetic containment and/or thermal management purposes.

An assembly that includes a toggle and a flap may generally be a single assembly. That is, a toggle-interlock assembly which includes a toggle and a flap may be configured as a substantially single component. Alternatively, a toggle, a rod, and a flap or interlock may be formed from separate parts that are physically coupled. In other words, a toggle-interlock assembly may be formed from separate parts that are coupled together, or may be integrally formed as a substantially single part.

A carrier, or carrier assembly, as mentioned above may be any module that may be inserted substantially directly into a chassis and is arranged to receive another module or sub-module. In one embodiment, the module or sub-module that is inserted into a carrier may be arranged to receive yet another module or sub-module. In other words, modules and/or sub-modules may be nested. Modules and/or sub-modules may comprise physical components associated with computing or networking equipment including, but not limited to including, electronic modules, line cards, power supply assemblies, power modules, memory cards, video graphic cards, processor cards, memory, or hard drive assemblies, etc.

The embodiments may be implemented as hardware, firmware, and/or software logic embodied in a tangible, i.e., non-transitory, medium that, when executed, is operable to perform the various methods and processes described above. That is, the logic may be embodied as physical arrangements, modules, structures, or components. A tangible medium may be substantially any computer-readable medium that is capable of storing logic or computer program code which may be executed, e.g., by a processor or an overall computing system, to perform methods and functions associated with the embodiments. Such computer-readable mediums may include, but are not limited to including, physical storage and/or memory devices. Executable logic may include, but is not limited to including, code devices, computer program code, and/or executable computer commands or instructions.

It should be appreciated that a computer-readable medium, or a machine-readable medium, may include transitory embodiments and/or non-transitory embodiments, e.g., signals or signals embodied in carrier waves. That is, a computer-readable medium may be associated with non-transitory tangible media and transitory propagating signals.

The steps associated with the methods of the present disclosure may vary widely. Steps may be added, removed, altered, combined, and reordered without departing from the spirit of the scope of the present disclosure. Therefore, the present examples are to be considered as illustrative and not restrictive, and the examples is not to be limited to the details given herein, but may be modified within the scope of the appended claims.

What is claimed is:

1. An apparatus comprising:
    a body, the body having an opening defined therein; and
    a toggle-interlock assembly, the toggle-interlock assembly being coupled to the body, the toggle-interlock assembly including a toggle portion and an interlock portion, the toggle-interlock assembly having a first configuration and a second configuration, wherein when the toggle-interlock assembly is in the first configuration, the toggle portion physically blocks at least part of the opening while the interlock portion is stowed, and wherein when the toggle-interlock assembly is in the second configuration, the toggle portion does not physically block access to the opening while the interlock portion is in a deployed position, the deployed position being arranged to prevent the apparatus from being inserted into a chassis.

2. The apparatus of claim 1 wherein the apparatus is a carrier assembly configured to be housed by the chassis.

3. The apparatus of claim 1 wherein the toggle-interlock assembly is a single assembly, the toggle-interlock assembly being configured to be rotated about a first axis, wherein when the toggle-interlock assembly is rotated to a first position, the toggle-interlock assembly is in the first configuration, and wherein when the toggle-interlock assembly is rotated to a second position, the toggle-interlock assembly is in the second configuration.

4. The apparatus of claim 1 wherein the opening is arranged to receive a sub-module, and wherein when the toggle-interlock assembly is in the first configuration, the sub-module is not insertable into the opening, and wherein when the toggle-interlock assembly is in the second configuration, the sub-module is insertable into the opening.

5. The apparatus of claim 1 further including:
a sub-module, the sub-module being positioned in the opening, wherein when the toggle-interlock assembly is in the first configuration, the sub-module is not removable from the opening, and wherein when the toggle-interlock assembly is in the second configuration, the sub-module is removable from the opening.

6. The apparatus of claim 5 wherein the sub-module is one selected from a group including a card, an adapter, and a blank.

7. An apparatus comprising:
a chassis, the chassis defining a first opening; and
a carrier assembly, the carrier assembly configured to be inserted at least partially within the first opening, the carrier assembly including a body and a toggle-interlock assembly, the body having a second opening defined therein, the toggle-interlock assembly being coupled to the body, the toggle-interlock assembly including a toggle portion and an interlock portion, the toggle-interlock assembly having a first configuration and a second configuration, wherein when the toggle-interlock assembly is in the first configuration, the carrier assembly is arranged to be removed from the first opening, and wherein when the toggle-interlock assembly is in the second configuration, the carrier assembly is arranged to be prevented from being removed from the first opening.

8. The apparatus of claim 7 wherein when the toggle-interlock assembly is in the first configuration, the toggle portion physically blocks at least part of the second opening while the interlock portion is stowed, and wherein when the toggle-interlock assembly is in the second configuration, the toggle portion does not physically block access to the second opening while the interlock portion is in a deployed position, the deployed position being arranged to prevent the apparatus from being inserted into a chassis.

9. The apparatus of claim 8 wherein the toggle-interlock assembly is a single assembly, the toggle-interlock assembly being configured to be rotated about a first axis, wherein when the toggle-interlock assembly is rotated to a first position, the toggle-interlock assembly is in the first configuration, and wherein when the toggle-interlock assembly is rotated to a second position, the toggle-interlock assembly is in the second configuration.

10. The apparatus of claim 8 wherein the second opening is arranged to receive a sub-module, and wherein when the toggle-interlock assembly is in the first configuration, the sub-module is not insertable into the second opening, and wherein when the toggle-interlock assembly is in the second configuration, the sub-module is insertable into the second opening.

11. The apparatus of claim 8 further including:
a sub-module, the sub-module being positioned in the second opening, wherein when the toggle-interlock assembly is in the first configuration, the sub-module is not removable from the second opening, and wherein when the toggle-interlock assembly is in the second configuration, the sub-module is removable from the second opening.

12. The apparatus of claim 11 wherein the sub-module is one selected from a group including a card, an adapter, and a blank.

13. A method comprising:
obtaining an assembly, the assembly including a body and a toggle-interlock assembly, the toggle-interlock assembly being coupled to the body the toggle-interlock assembly including a toggle portion and an interlock portion, the body having an opening defined therein, the toggle-interlock assembly being in a first configuration such that the toggle portion physically blocks at least part of the opening while the interlock portion is stowed;
inserting the assembly into a chassis; and
configuring the toggle-lock assembly in a second configuration, wherein when the toggle-interlock assembly is in the second configuration, the toggle portion does not physically block access to the opening while the interlock portion is in a deployed position, the deployed position being arranged to prevent the apparatus from being removed from the chassis.

14. The method of claim 13 further including:
obtaining a sub-module;
inserting the sub-module into the opening when the toggle-lock assembly is in the second configuration; and
configuring the toggle-lock assembly in the first configuration, wherein when the toggle-lock assembly is configured in the first configuration, the sub-module is not removable from the opening.

15. The method of claim 14 wherein the sub-module is one selected from a group including a card, an adapter, and a blank.

* * * * *